United States Patent
Preising et al.

(10) Patent No.: US 10,749,325 B2
(45) Date of Patent: Aug. 18, 2020

(54) BUSBAR COMPRISING A METAL-SHEET STACK AND METHOD FOR PRODUCING A BUSBAR

(71) Applicant: Schaeffler Technologies AG & Co. KG, Herzogenaurach (DE)

(72) Inventors: Stephan Preising, München (DE); Nicolai Gramann, Renchen (DE); Daniel Eckstein, Ottersweier-Unzhurst (DE); Eduard Enderle, Gengenbach (DE)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 0 days.

(21) Appl. No.: 16/349,650

(22) PCT Filed: Oct. 11, 2017

(86) PCT No.: PCT/DE2017/100858
§ 371 (c)(1),
(2) Date: May 14, 2019

(87) PCT Pub. No.: WO2018/091021
PCT Pub. Date: May 24, 2018

(65) Prior Publication Data
US 2019/0348828 A1     Nov. 14, 2019

(30) Foreign Application Priority Data
Nov. 18, 2016  (DE) .......................... 10 2016 222 760

(51) Int. Cl.
*H02G 5/00*      (2006.01)
*H05K 7/14*      (2006.01)

(52) U.S. Cl.
CPC ........... *H02G 5/005* (2013.01); *H05K 7/1432* (2013.01)

(58) Field of Classification Search
CPC ........ H05K 7/1432; H02G 5/005; H02G 5/06; H02M 7/003
See application file for complete search history.

(56) References Cited

U.S. PATENT DOCUMENTS

| 5,422,440 | A | * | 6/1995 | Palma | H02G 5/005 174/133 B |
| 6,525,950 | B1 | * | 2/2003 | Shirakawa | H02M 7/003 307/148 |
| 7,102,256 | B2 | * | 9/2006 | Murakami | H02G 5/005 174/117 F |

(Continued)

FOREIGN PATENT DOCUMENTS

| CN | 202034451 U | 11/2011 |
| CN | 202111245 U | 1/2012 |

(Continued)

*Primary Examiner* — Timothy J Thompson
*Assistant Examiner* — Amol H Patel
(74) *Attorney, Agent, or Firm* — LeKeisha M. Suggs

(57) ABSTRACT

A busbar for power electronics is disclosed for connecting a first electrical element to a second electrical element. The busbar includes at least one positive lamination as a first current-carrying element and at least one negative lamination as a second current-carrying element. The at least one positive lamination is arranged on the at least one negative lamination in such a way to form a laminated stack.

11 Claims, 3 Drawing Sheets

(56) References Cited

U.S. PATENT DOCUMENTS

| | | | | |
|---|---|---|---|---|
| 9,979,173 B2* | 5/2018 | Benavides | ............. | H02G 5/005 |
| 10,135,355 B2* | 11/2018 | Doo | ...................... | H02M 7/003 |
| 2010/0089641 A1* | 4/2010 | Esmaili | ................ | H05K 7/1432 |
| | | | | 174/70 B |
| 2015/0035496 A1* | 2/2015 | Kikuchi | .................. | B60L 53/14 |
| | | | | 320/137 |
| 2019/0067167 A1* | 2/2019 | Hong | ...................... | H01L 25/16 |

FOREIGN PATENT DOCUMENTS

| | | |
|---|---|---|
| CN | 102385943 A | 3/2012 |
| CN | 202523941 U | 11/2012 |
| CN | 203434841 U | 2/2014 |
| DE | 102008061421 A1 | 6/2009 |
| DE | 102010035798 A1 | 3/2011 |
| DE | 102010049620 A1 | 5/2011 |
| DE | 102013221834 A1 | 4/2015 |

* cited by examiner

BUSBAR COMPRISING A METAL-SHEET STACK AND METHOD FOR PRODUCING A BUSBAR

CROSS-REFERENCE TO RELATED APPLICATIONS

This application is the U.S. National Phase of PCT Appln. No. PCT/DE2017/100858 filed Oct. 11, 2017, which claims priority to DE 10 2016 222 760.2 filed Nov. 18, 2016, the entire disclosures of which are incorporated by reference herein.

TECHNICAL FIELD

The present disclosure relates to a busbar for power electronics, for connecting a first electrical element, for instance an indirect capacitor, to a second electrical element, for example a power module. The busbar has at least one positive lamination as a conducting element for current transmission, for instance for direct current transmission, and at least one negative lamination, likewise as a conducting element for current transmission, for instance for direct current transmission.

The present disclosure furthermore relates to a method for producing a busbar according to the present disclosure.

BACKGROUND

Generic busbars in power electronics, for instance for controlling a half bridge which is preferably used in an inverter, are known from the prior art. German patent application DE 10 2010 035 798 A1, for instance, discloses an electromechanical actuator having an electrically operated rotor of a brushless direct current motor.

A generic device is also known from German patent application DE 10 2010 049620 A1. This discloses a stator assembly for multi-phase machines having a plurality of magnetically soft stator segments which are individually wound with coils and can be connected to a yoke, wherein the coils of a phase are connected in series.

German patent application DE 10 2008 061 421 A1 should likewise be classed as the prior art. This discloses a central electricity distribution element for an electric induction machine. The electricity distribution element possesses busbars associated with the individual phases for connecting coils of the same phases which are arranged in the stator of the electric machine. Furthermore, in that document, a busbar is arranged in the insulating portion, which has a circular holding groove for receiving a respective busbar and insulating the respective busbars from one another.

This prior art is disadvantageous in that the busbars have a high leakage inductance, for instance, i.e. a high inductance component which is generated by the leakage flux in magnetically coupled systems. This reduces the reliability on the one hand and the power density of the system on the other, since an arrangement of active filters is required, which, as additional components, call for additional installation space. Furthermore, the busbars known from the prior art are not capable of compensating mechanical tolerances. This in turn has a negative impact on the useful life of the components since they are exposed to basic mechanical stress.

SUMMARY

The object of the present disclosure therefore consists in eliminating or at least alleviating the disadvantages of the prior art and, in particular, in developing a device and a method which realize power electronics with as high a power density as possible and, at the same time, withstand mechanical loads more robustly.

According to the present disclosure, this is achieved by means of a device which arranges the at least one positive lamination stacked on the at least one negative lamination in such a way that they form a laminated stack. Conventional filter circuits are therefore removed, which has a positive impact on the installation-space requirement. In addition, such stacking enables a specific conductor bar guidance which keeps the leakage inductance low. Therefore, overvoltage peaks during switching procedures are reduced, which moreover enables the omission of resistanceless capacitors, i.e. snubber capacitors. The object is furthermore achieved by means of a method according to the present disclosure for producing such a busbar.

Advantageous embodiments are moreover the subject matter of the claims and will be explained in more detail below.

It is therefore advantageous if the laminated stack is composed of more than one positive lamination, preferably four positive laminations, and more than one negative lamination, preferably four negative laminations, which are arranged mutually alternately stacked in each case. The alternation results in an identical number of positive and negative laminations. Reliable current transmission is therefore ensured. As a result of the laminations furthermore having a small thickness, i.e. having a small depth as measured along their width and their height, a high degree of flexibility is achieved by means of this arrangement. Manufacturing tolerances can therefore be compensated. Furthermore, by means of the increased flexibility, it is ensured that the thermal expansion of different components having different expansion coefficients does not lead to residual stresses.

The advantages according to the present disclosure are revealed in particular when the positive lamination is arranged with respect to the negative lamination in each case in such a way that the current transmission takes place crosswise so that a leakage flux generated by a current flow through the positive lamination is able to compensate a leakage flux generated by a current flow through the negative lamination. It should be mentioned here that, according to the essential feature of the present disclosure, the positive lamination and the negative lamination can also be a plurality of laminations in each case.

In a further advantageous embodiment, the positive lamination and the negative lamination have an identical form. They are therefore configured as an identical part, which brings about economical and logistical advantages. The respective laminations are also electrically insulated from one another in order to ensure operational safety.

It is likewise advantageous if each lamination of the laminated stack has a feed connection and a discharge connection, wherein the feed connection and the discharge connection each lie transversely to a plane in which the laminated stack is formed. An interface to the respective electrical elements is thus ensured. In this case, the plane of the laminated stack refers to the plane in which any lamination extends. The other laminations extend plane-parallel to that particular plane.

Advantages in terms of the installation space are realized as soon as the feed connection and/or the discharge connection lie in a plane which is orthogonal to the plane in which the laminated stack is formed. Therefore, for two elements which are offset from one another, a connection is produced in the narrowest of spaces.

A further advantageous embodiment is notable in that the feed connection of the positive lamination is arranged on a first side of the laminated stack and the discharge connection of the positive lamination is arranged on a second side of the laminated stack and the first side is arranged opposite the second side. This defines clear connection interfaces.

Also, if the feed connection of the negative lamination is arranged on the second side of the laminated stack and the discharge connection of the negative lamination is arranged on the first side of the laminated stack so that the feed and discharge connections of the positive lamination and the negative lamination are arranged mutually alternately and/or crosswise, the object according to the present disclosure is furthermore achieved since the leakage inductance is thus efficiently reduced.

It is likewise advantageous if the laminated stack has such elastic properties that it is capable of compensating mechanical tolerances in the arrangement between the first electrical element, such as the indirect capacitor, and the second electrical element, such as the power module. This increases the useful life of the system as a whole since residual stresses are prevented or at least reduced.

The present disclosure moreover relates to a method for producing a busbar. This has, for instance, the followings steps:

Providing, for instance punching, a first lamination;
Providing, for instance punching, a second lamination, which is able to transmit opposite charges to the first lamination and which has a substantially identical form to the first lamination;
Stacking the first lamination on the second lamination; an insulator is arranged between the individual laminations here;
Shaping the ends of the stacked laminations; this shaping step can also be carried out on the respective individual lamination in an alternative embodiment;
Introducing openings into the shaped ends of the stacked laminations to realize the feed and discharge connections.

These steps are preferably carried out in time succession. As a result of the fact that the respective drilling only takes place after the stacking, it is possible to use identical parts as the laminations, which increases the economic efficiency of this method.

In other words, the present disclosure describes a conductive connection of current-carrying elements for power electronics. High requirements are made of such connections in different disciplines. In addition to electrical requirements, for instance electrical conductivity, insulation capacity and/or low self-inductance, mechanical requirements, for instance tolerance compensation, thermal conductivity and/or flexible connection options, should be fulfilled.

Therefore, the present disclosure comprises a busbar, also known as a conductor bar, which induces a low leakage inductance to increase the power density of power electronics. This is demonstrated in the system as a whole, i.e. in the drive train of an electric vehicle or a hybrid vehicle, for instance, by reducing voltage peaks during switching procedures in an indirect circuit of the power electronics. At the same time, a mechanical tolerance compensation is realized as a result of the flexibility of the conductor bar owing to stacked identically formed laminations. The individual laminations are electrically insulated from one another and applied in layers. Since the current flow runs crosswise as a result of this layering, the magnetic interference fields compensate each other.

In the method according to the present disclosure, openings, for instance made by drilling, are arranged in specifically provided connection regions after the stacking of the laminations. This sequence enables an identical part to be used in each case for all eight bars, for instance. The electrical insulators also each possess the same dimensions and properties. The conductor bars according to the present disclosure can be produced economically owing to the resulting high number of identical parts.

In summary, the present disclosure therefore has as its subject matter the provision of a conductor bar having a low leakage inductance in order to increase the power density of power electronics. It is preferably used in the connection of indirect capacitors and power modules.

BRIEF DESCRIPTION OF THE DRAWINGS

The present disclosure will be explained in more detail below by means of figures, which show.

The drawings are merely schematic in nature and serve solely for understanding of the present disclosure. Identical elements are provided with the same reference signs.

DETAILED DESCRIPTION

Figure 1:
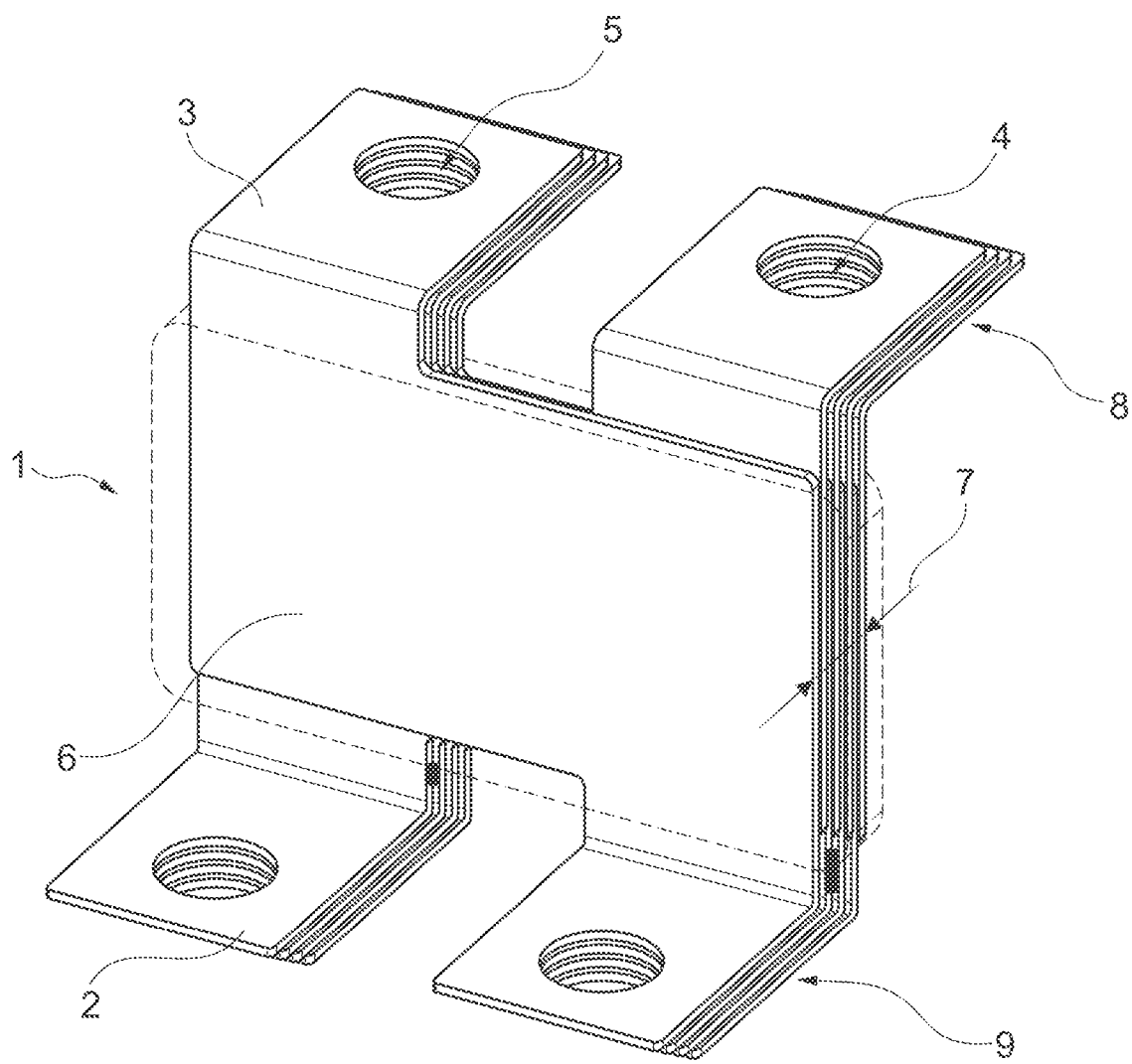
FIG. 1: a busbar having a laminated stack.

FIG. 1 shows a busbar 1 for power electronics, having four stacked positive laminations 2, which are able to transmit a direct current. Four negative laminations 3 are stacked alternately with the positive laminations 2. The positive laminations 2 have, at their ends, a respective first opening 4 which represents an interface to a connected electrical component. Likewise, the negative laminations each have, at their ends, a second opening 5, which likewise represents an interface to a connected electrical component.

As a result of the alternating arrangement of the positive and negative laminations 2, 3, a laminated stack 6 having a stack thickness 7 is achieved. The stack thickness 7 is determined by the respective lamination thickness, the thickness of the insulators, and the number of laminations 2, 3. It is selected such that the laminated stack has a certain elasticity so that the first and second openings 4, 5 can be seated on supports which have a mutual tolerance-related offset. A feed region 8, also referred to as a feed connection, can be connected to a first electrical element, whilst a discharge region 9, which is also referred to as a discharge connection, can be connected to a second electrical element. The regions 8, 9 lie in a plane which is transverse to the plane of the laminated stack 6. The openings 4, 5 are arranged in the regions 8, 9.

Figure 2:
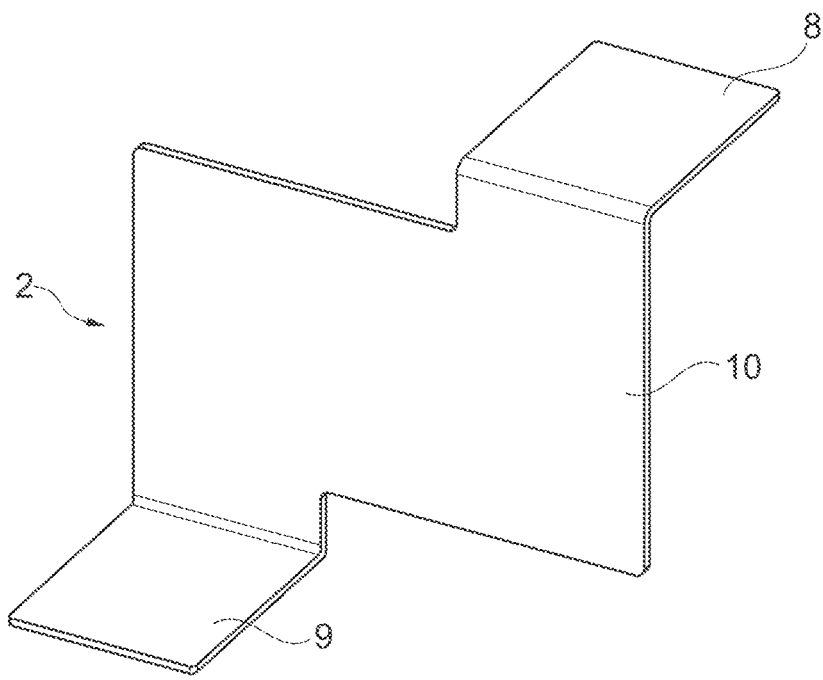
FIG. 2: a positive lamination, which is part of the laminated stack.

In FIG. 2, a positive lamination 2 is shown in its own right in a state in which it will be stacked with the negative lamination 3. In this state, first openings 4 are not yet incorporated in the feed region 8 and the discharge region 9. A stack region 10 of the positive lamination 2 has a substantially rectangular form. This is suitable for transmitting high current quantities. The stack region 10 is furthermore surrounded by an insulator. The feed and the discharge region 8, 9 of the positive lamination 2 are shaped at a right angle with respect to the stack region.

Figure 3:
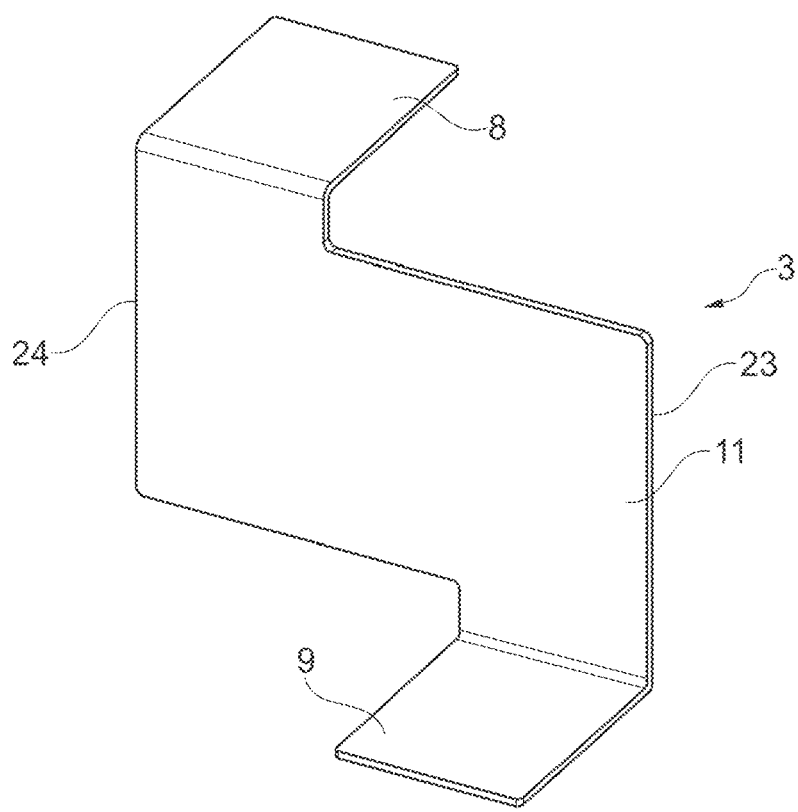
FIG. 3: a negative lamination, which is part of the laminated stack.

FIG. 3 shows the negative lamination 3 in a state before the second openings 5 are incorporated in the feed region 8 and the discharge region 9. The negative lamination 3 is rotated through 180° relative to the positive lamination 2 about an axis which extends parallel to the longitudinal axes of a stack region 11 of the negative lamination 3. Therefore, both components are an identical component. A first side 23 and a second side 24 are defined after the rotation through 180°. Whilst the feed region 8 of the positive lamination 2 is arranged on the first side 23 and the discharge region 9 of the positive lamination 2 is arranged on the second side 24, this is precisely the other way round for the negative lamination 3.

Figure 4:
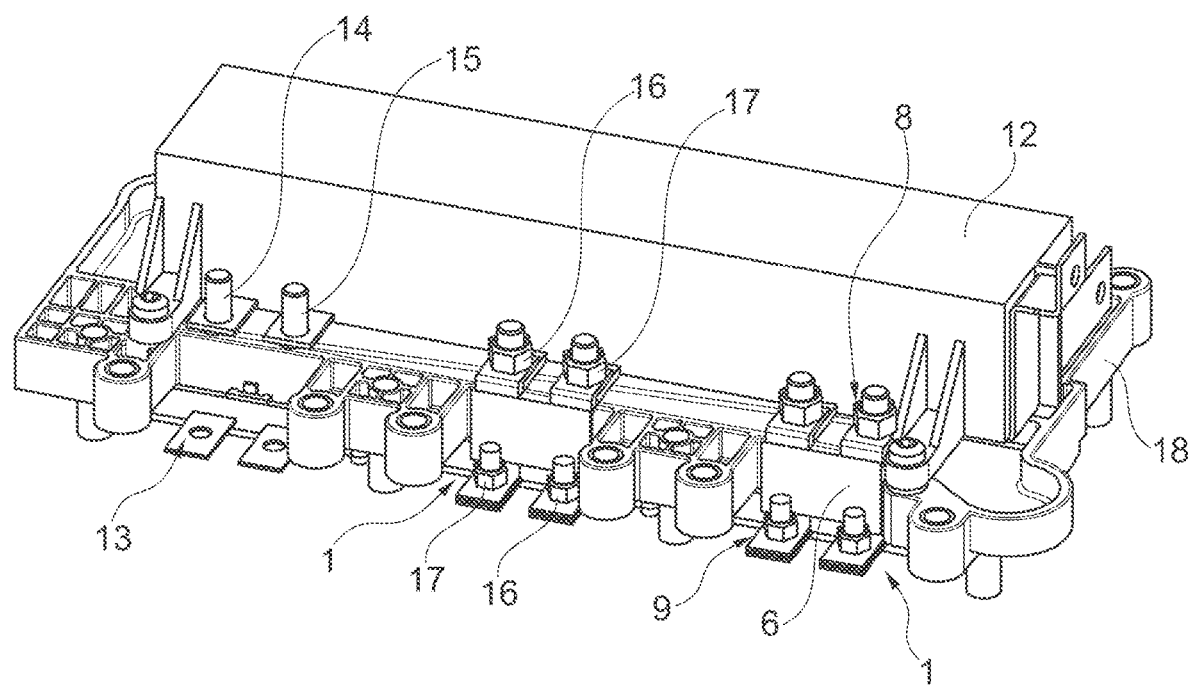
FIG. 4: a plurality of busbars in an installed state in an interface between a capacitor and a power module.

In FIG. 4, busbars 1 are illustrated in an installed state between a capacitor 12 and power module connection 13. A discharge contact 14 has a form such that it projects through the second opening 5 of the negative lamination 3. Accordingly, a feed contact 15 has a form such that it projects through the first opening 4 of the positive lamination 2. For a secure connection between the contacts 14, 15 and the openings 4, 5, a discharge nut 16 and a feed nut 17 can furthermore preferably be screwed to the contacts 14, 15.

A frame 18, to which the capacitor 12 is screwed, can be coupled to a power module (not illustrated) in such a way that the power module connections 13 likewise produce a robust connection with the busbar 1 by means of the nuts 16, 17.

Figure 5:
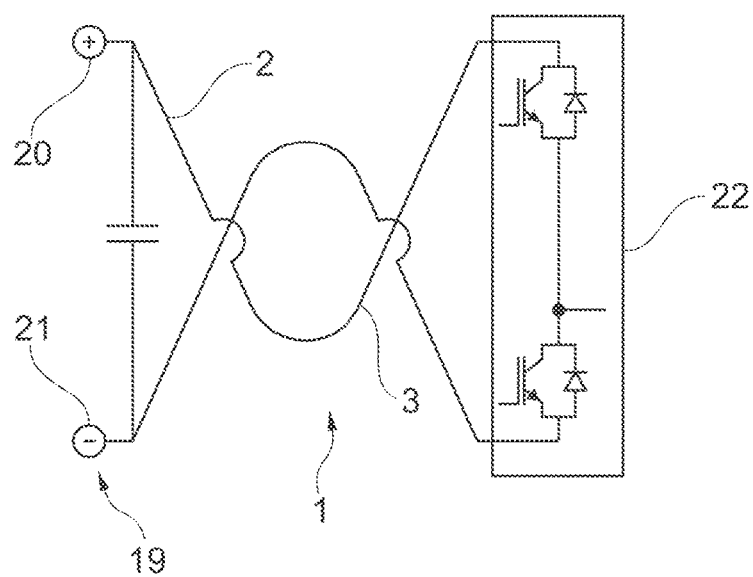
FIG. 5: a circuit diagram of the busbar, which is arranged between a voltage source and a half bridge.

A circuit diagram of the busbar 1 is illustrated in FIG. 5. Between a voltage source 19, which has a positive pole 20 and a negative pole 21, and a half bridge 22, the positive lamination 2 and the negative lamination 3 are arranged crosswise in such a way that they keep the leakage inductance low. The electrical switching elements in the half bridge 22 are formed, for example, as transistors, in particular as power transistors. The transistors are advantageously in turn formed as field effect transistors, for example MOSFETs and/or bipolar transistors, for example as IGBTs. The half bridge 22 is, for instance, a constituent part of a B6 bridge circuit.

LIST OF REFERENCE SIGNS

Busbar
Positive lamination
Negative lamination
First opening
Second opening
Laminated stack
Stack thickness
Feed region
Discharge region
Stack region of the positive lamination
Stack region of the negative lamination
Capacitor
Power module connection
Discharge contact
Feed contact
Discharge nut
Feed nut
Frame
Voltage source
Positive pole
Negative pole
Half bridge
First side
Second side

The invention claimed is:

1. A busbar for power electronics, for connecting a first electrical element to a second electrical element, comprising: at least one positive lamination as a first current-carrying element and at least one negative lamination as a second current-carrying element, wherein the at least one positive lamination is arranged on the at least one negative lamination in such a way to form a laminated stack, wherein the at least one positive lamination and the at least one negative lamination each include:
    a stack region having a substantially rectangular form,
    an insulation layer surrounding the stack region, and
    a feed connection and a discharge connection formed integrally with the stack region, arranged on opposite sides of the stack region, and shaped at a right angle with respect to the stack region.

2. The busbar as claimed in claim 1, wherein the laminated stack is composed of more than one positive lamination and more than one negative lamination, which are arranged mutually alternately stacked in each case.

3. The busbar as claimed in claim 1, wherein the positive lamination is arranged with respect to the negative lamination in each case in such a way that a current transmission takes place crosswise so that a leakage flux generated by a current flow through the positive lamination is able to compensate a leakage flux generated by a current flow through the negative lamination.

4. The busbar as claimed in claim 1, wherein the positive lamination and the negative lamination have an identical form and are electrically insulated from one another in each case.

5. The busbar as claimed in claim 1, wherein each lamination of the laminated stack has a feed connection and a discharge connection, wherein the feed connection and the discharge connection each lie transversely to a plane in which the laminated stack is formed.

6. The busbar as claimed in claim 5, wherein the feed connection and/or the discharge connection lie in a plane which is orthogonal to the plane in which the laminated stack is formed.

7. The busbar as claimed in claim 5, wherein the feed connection of the positive lamination is arranged on a first side of the laminated stack and the discharge connection of the positive lamination is arranged on a second side of the laminated stack and the first side is arranged opposite the second side.

8. The busbar as claimed in claim 7, wherein the feed connection of the negative lamination is arranged on the second side of the laminated stack and the discharge connection of the negative lamination is arranged on the first side of the laminated stack, so that the feed and discharge connections of the positive lamination and the negative lamination are arranged mutually alternately in each case.

9. The busbar as claimed in claim 1, wherein the laminated stack has such elastic properties that it is capable of compensating mechanical tolerances in an arrangement between the first electrical element and the second electrical element.

10. A method for producing a busbar, comprising:
    Providing a first lamination;
    Providing a second lamination, which is able to transmit opposite charges to the first lamination and which has a substantially identical form to the first lamination;
    Stacking the first lamination on the second lamination;

Shaping ends of the stacked laminations;
an insulation layer surrounding the stack region, and
Introducing openings into the shaped ends of the stacked laminations to realize feed and discharge connections, wherein the first lamination and the section lamination each include:
a stack region having a substantially rectangular form, and
a first shaped end and a second shaped end formed integrally with the stack region, arranged on opposite sides of the stack region, and shaped at a right angle with respect to the stack region.

11. The method of claim 10, further comprising rotating the second lamination 180° relative to the first lamination about an axis that extends parallel to a longitudinal axis of the stack region of the second lamination.

\* \* \* \* \*